US012808919B2

(12) United States Patent
Shu et al.

(10) Patent No.: US 12,808,919 B2
(45) Date of Patent: Nov. 24, 2026

(54) ACTIVE ARC VOLTAGE-CURRENT CONVERSION METHOD, SYSTEM, AND MEDIUM FOR DISTRIBUTION NETWORKS

(71) Applicant: Kunming University of Science and Technology, Kunming (CN)

(72) Inventors: Hongchun Shu, Kunming (CN); Jun Dong, Kunming (CN); Yutao Tang, Kunming (CN); Yuan Gao, Kunming (CN); Yiming Han, Kunming (CN); Weijie Lou, Kunming (CN); Guangxue Wang, Kunming (CN); Hongfang Zhao, Kunming (CN)

(73) Assignee: Kunming University of Science and Technology, Kunming (CN)

( * ) Notice: Subject to any disclaimer, the term of this patent is extended or adjusted under 35 U.S.C. 154(b) by 218 days.

(21) Appl. No.: 18/898,636

(22) Filed: Sep. 26, 2024

(65) Prior Publication Data

US 2025/0167541 A1 May 22, 2025

(30) Foreign Application Priority Data

Nov. 17, 2023 (CN) ........................ 202311532461.9

(51) Int. Cl.
*G01R 31/08* (2020.01)
*H02H 1/00* (2006.01)
(Continued)

(52) U.S. Cl.
CPC ......... *G01R 31/086* (2013.01); *H02H 1/0007* (2013.01); *H02H 7/22* (2013.01); *H02H 9/08* (2013.01)

(58) Field of Classification Search
CPC .. G01R 25/005; G01R 31/085; G01R 31/086; G01R 31/088; G01R 31/52;
(Continued)

(56) References Cited

U.S. PATENT DOCUMENTS 11,398,725 B2 * 7/2022 Rorabaugh ............ G01R 31/62
2016/0061873 A1 * 3/2016 Liu ...................... G01R 31/088
702/59

(Continued)

FOREIGN PATENT DOCUMENTS

CN 101075737 A 11/2007
CN 101212138 A 7/2008

(Continued)

*Primary Examiner* — Alex Torres-Rivera
(74) *Attorney, Agent, or Firm* — Sang Young Han

(57) ABSTRACT

The provided are a method, system, and medium for active arc-extinguishing voltage-current conversion in distribution networks. The method includes: detecting a single-phase-to-ground fault in the distribution network and identifying the target faulty phase; injecting compensating currents into the target faulty phase to reduce its voltage; measuring the residual current at the fault point during the injection of compensating currents and the zero-sequence voltage of the target faulty phase; determining a critical zero-sequence voltage threshold based on the residual current at the fault point and assessing whether this critical value exceeds the present zero-sequence voltage; if so, ceasing the injection of compensating currents into the target faulty phase and instead injecting active arc-extinguishing currents at the neutral point of the distribution network to mitigate ground currents at the grounding points of the distribution network. The objective is to enhance the applicability of arc-extinguishing methods for ground faults in distribution networks.

17 Claims, 7 Drawing Sheets

(51) Int. Cl.
*H02H 7/22* (2006.01)
*H02H 9/08* (2006.01)

(58) Field of Classification Search
CPC .... H02H 1/0007; H02H 1/0015; H02H 1/003; H02H 7/22; H02H 9/04; H02H 9/045; H02H 9/08; H02J 3/0012
See application file for complete search history.

(56) References Cited

U.S. PATENT DOCUMENTS

| | | | | |
|---|---|---|---|---|
| 2020/0083702 | A1* | 3/2020 | Zeng | H02H 9/002 |
| 2021/0126450 | A1* | 4/2021 | Zeng | G01R 31/086 |
| 2021/0270885 | A1* | 9/2021 | Yang | G01R 27/18 |
| 2025/0158400 | A1* | 5/2025 | Shu | G01R 31/52 |

FOREIGN PATENT DOCUMENTS

| | | | | | |
|---|---|---|---|---|---|
| CN | 101291054 | A | * | 10/2008 | |
| CN | 102074950 | A | | 5/2011 | |
| CN | 102130450 | A | | 7/2011 | |
| CN | 102638033 | A | | 8/2012 | |
| CN | 103199520 | A | | 7/2013 | |
| CN | 103368167 | A | | 10/2013 | |
| CN | 105322528 | A | | 2/2016 | |
| CN | 106602540 | A | | 4/2017 | |
| CN | 107843809 | A | * | 3/2018 | G01R 31/088 |
| CN | 112234596 | A | | 1/2021 | |
| CN | 112260249 | A | | 1/2021 | |
| CN | 112271714 | A | | 1/2021 | |
| CN | 113765109 | A | * | 12/2021 | H02H 3/066 |
| CN | 115622015 | A | * | 1/2023 | H02H 9/08 |
| DE | 102012112480 | A1 | | 5/2014 | |
| EP | 3657620 | A1 | | 5/2020 | |
| WO | 2014063666 | A2 | | 5/2014 | |

* cited by examiner

ACTIVE ARC VOLTAGE-CURRENT CONVERSION METHOD, SYSTEM, AND MEDIUM FOR DISTRIBUTION NETWORKS

CROSS-REFERENCE TO THE RELATED APPLICATIONS

This application is based upon and claims priority to Chinese Patent Application No. 202311532461.9, filed on Nov. 17, 2023, the entire contents of which are incorporated herein by reference.

TECHNICAL FIELD

This invention pertains to the field of relay protection technology, specifically addressing an active arc voltage-current conversion method, system, and medium for distribution networks.

BACKGROUND

Within the realm of arc suppression for grounding faults in distribution networks, relevant technical solutions can be categorized into voltage-based and current-based arc suppression methods. Voltage-based arc suppression reduces the faulty phase voltage to zero, whereas current-based arc suppression reduces the fault point current to zero.

Voltage-based methods are typically effective for high-resistance faults but exhibit suboptimal performance for faults with low resistance, such as those involving conductive materials. Conversely, current-based methods are suited for low-resistance faults but are less effective for high-resistance faults.

Due to the specific limitations of each method in various fault scenarios, there is a need for a method capable of simultaneously addressing high and low-resistance faults to enhance the applicability of grounding fault arc suppression in distribution networks, thereby ensuring safe and reliable operation.

The Journal of Power System Automation, Volume 41, Issue 8, has disclosed a flexible optimization method for distribution network arc suppression that adapts to changes in line parameters and loads. This method integrates the advantages of both voltage and current-based arc suppression methods, thereby mitigating the shortcomings associated with single-method approaches. However, it should be noted that faults involving conductive materials occur less frequently compared to high and low-resistance faults. Existing methods have demonstrated limited applicability to high-frequency occurrences of high and low-resistance grounding faults.

The above discussion serves solely to aid in understanding the technical framework of the present invention and does not imply recognition of the aforementioned content as prior art.

SUMMARY

The primary objective of this invention is to present an active arc voltage-current conversion method for distribution networks, aimed at enhancing the applicability of grounding fault arc suppression methods.

To achieve this goal, the invention provides an active arc voltage-current conversion method for distribution networks, comprising:

Detecting a single-phase-to-ground fault in the distribution network and identifying the target faulty phase.

Injecting compensating currents into the identified faulty phase to reduce its voltage.

Obtaining the residual current value at the fault point of the target faulty phase during the injection of compensating currents, as well as the present zero-sequence voltage of the target faulty phase.

Determining the critical zero-sequence voltage threshold based on the present residual current value at the fault point, and checking if this critical value exceeds the present zero-sequence voltage.

If it does, ceasing the injection of compensating currents into the target faulty phase and instead injecting active arc-suppression currents into the neutral point of the distribution network to reduce the ground current at the grounding point of the distribution network.

Optionally, the steps for determining the zero-sequence voltage threshold based on the residual current value at the present fault point include:

- Determining the absolute product of the residual current value at the present fault point and the initial voltage value of the faulty phase prior to the fault occurrence; and
- Obtaining the additional excitation voltage at the fault point after injecting compensating currents, predefined admittance parameters, faulty phase electromotive force, and the line voltage drop from the bus to the fault point.

Based on the residual current value at the present fault point, the initial voltage value before the fault occurred, the additional excitation voltage injected, predefined admittance parameters, faulty phase electromotive force, and the line voltage drop, the critical zero-sequence voltage threshold is determined.

Optionally, the current value of the compensating current is:

$$I_{in} = -E_A(Y_B + Y_C + Y_0 + Y_{con}) + E_B Y_B + E_C Y_C$$

Here, $I_{in}$ denotes the compensating current, $Y_B$, $Y_C$ represents the ground admittance for phases B and C of the normal phase, $Y_0$ denotes the ground admittance for the neutral point, $Y_{con}$ signifies the ground admittance for the active inverter, $E_A$ stands for the electromotive force of phase A, $E_B$ for phase B, and $E_C$ for phase C.

Optionally, the steps for determining the target faulty phase include:

Obtaining the neutral point voltage and busbar voltage in the distribution network.

Determining a fault voltage threshold based on the busbar voltage and a predefined scaling factor.

Assessing whether the neutral point voltage is greater than or equal to the fault voltage threshold.

If affirmative, identifying the occurrence of a single-phase-to-ground fault in the distribution network.

If negative, determining the absence of a single-phase-to-ground fault in the distribution network.

The method disclosed in this invention utilizes voltage-controlled arc extinguishing with disturbance rejection for extinguishing frequent high and low impedance arc faults in distribution networks. If the zero-sequence voltage remains below a threshold continuously, it is determined that a metallic grounding fault has occurred, prompting the activation of current-controlled arc extinguishing. This disclosed method enables active arc extinguishing for all types of grounding fault arcs, addressing the issue of limited applicability found in existing methods.

Furthermore, to achieve the aforementioned objectives, the present invention also provides an active arc extinguishing voltage-current conversion system for distribution networks. The system is characterized by its application of the active arc extinguishing voltage-current conversion method for distribution networks described above. The active arc extinguishing voltage-current conversion system comprises:

A protection initiation module used to identify the target faulty phase upon detecting a single-phase grounding fault in the distribution network.

A voltage arc extinction module employed to inject compensating currents into the identified faulty phase to reduce its voltage. Injection ceases when the present zero-sequence voltage value is less than or equal to the critical zero-sequence voltage threshold.

An arc extinction mode switching discrimination module designed to acquire the residual current value at the present fault point and the present zero-sequence voltage value of the target faulty phase during the injection of compensating currents. It determines the critical zero-sequence voltage threshold based on the residual current value at the present fault point and verifies whether this threshold exceeds the present zero-sequence voltage value.

A current arc extinction module that compensates for active arc currents at the neutral point of the distribution network when the critical zero-sequence voltage threshold exceeds the present zero-sequence voltage value.

Optionally, the active arc extinguishing voltage-current conversion system for distribution networks further includes a control module. The control module comprises:

A voltage-current dual disturbance rejection closed-loop control module, utilized to regulate the current magnitude for voltage arc extinction.

A quasi-proportional resonance closed-loop control module, employed to regulate the current magnitude for current arc extinction.

Optionally, the voltage arc extinguishing module includes an active inverter unit. Through this active inverter unit, the voltage arc extinguishing module injects an adjustable zero-sequence current into the neutral point of the distribution network. This action aims to control the point voltage of the zero-sequence loop to be equal in magnitude but opposite in direction to the source electromotive force of the faulty phase.

Optionally, the current arc extinguishing module includes an arc extinguishing coil and an equivalent controllable current source.

In this configuration, the arc extinguishing coil is connected in parallel with the equivalent controllable current source. The arc extinguishing coil compensates for the fundamental frequency capacitive current in the distribution network, while the equivalent controllable current source compensates for the active, reactive, and harmonic components of residual current after arc extinguishing into the distribution network.

Additionally, to achieve the aforementioned objectives, the present invention further provides a computer-readable storage medium. The computer-readable storage medium stores a program for active arc extinguishing voltage-current conversion in distribution networks. When executed by a processor, the program implements the steps of any of the methods for active arc extinguishing voltage-current conversion in distribution networks as described above.

The embodiments of the present invention provide a method, system, and medium for active arc extinguishing voltage-current conversion in distribution networks. Initially, a voltage arc extinguishing strategy is employed to extinguish the targeted faulty phase in the distribution network. During this process, the residual current value at the fault point is calculated to determine the critical threshold of zero-sequence voltage. Based on whether this threshold exceeds the zero-sequence voltage, it is determined whether the faulty phase is in the voltage arc extinguishing dead zone. If so, the strategy shifts to a current arc extinguishing approach. This involves compensating active arc extinguishing current at the neutral point of the distribution network to reduce the current at grounding points, thereby controlling the fault current to zero at grounding points and facilitating automatic switching between voltage arc extinguishing and current arc extinguishing strategies.

DETAILED DESCRIPTION OF THE EMBODIMENTS

Figure 1:
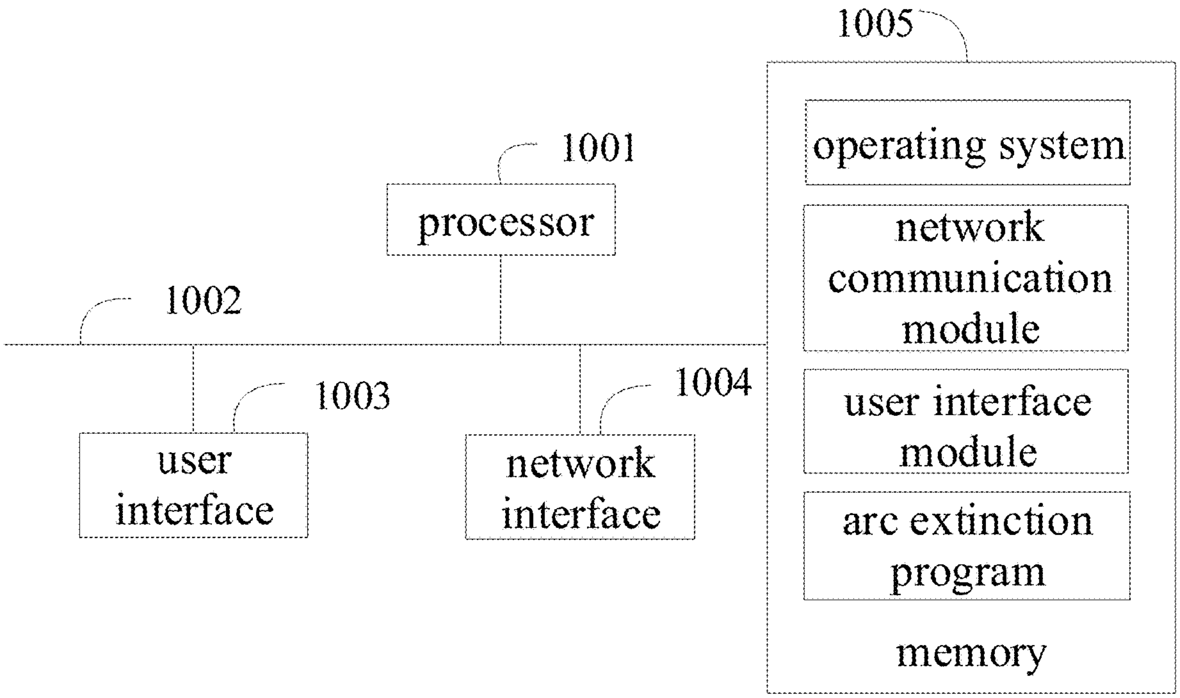
FIG. 1 illustrates the architectural diagram of the hardware operational environment of the active arc extinguishing voltage-current conversion system in distribution networks, as implemented in embodiments of the present invention.

In China's distribution networks, resonant grounding is widely employed. During a single-phase ground fault, arc suppression coils compensate for capacitive currents at the fault point, facilitating fault isolation and self-healing in distribution networks. However, with the increasing deployment of underground cables in urban distribution networks, the current from single-phase ground faults has surged, making it difficult to extinguish arcs and leading to phase-to-phase short circuits, thereby exacerbating the fault. Additionally, the widespread use of power electronic devices and nonlinear loads in distribution networks introduces not only fundamental frequency capacitive components but also active and harmonic components into fault currents. Conventional arc suppression coils are inadequate to compensate for these components, necessitating the development of active arc suppression technology. Depending on the control objective, active arc suppression technology can be categorized into current-type and voltage-type suppression. Current-type suppression aims to nullify fault point currents, whereas voltage-type suppression aims to nullify faulty phase voltages, thereby extinguishing the arc.

Active current-type arc suppression injects current into the neutral point to restrict fault currents to zero. Current implementations use zero-sequence voltage to calculate compensating currents, effectively suppressing faults with low-resistance and solid ground faults. However, inaccurate ground parameter measurements lead to significant residual currents during ground faults, complicating compensation for harmonic components of fault currents and failing to suppress intermittent arcing faults. Additionally, it performs poorly in high-resistance ground faults. Active voltage-type arc suppression, on the other hand, utilizes active inverters to inject controllable zero-sequence currents into the neutral point of the distribution network. This approach aims to control the zero-sequence voltage of the faulty phase such that it equals the source electromotive force in magnitude but opposite in direction, thereby reducing faulty phase voltages to zero. This method proves effective against high-resistance ground faults and intermittent arcing faults. However, when the ground point's transient resistance is significantly lower than the impedance between the fault point and the busbar, fault currents are influenced by load currents, potentially increasing rather than decreasing when voltage-type arc suppression is applied.

Based on the advantages and disadvantages of the aforementioned arc extinction methods, this invention proposes an active arc extinction voltage-current conversion method for distribution networks. By leveraging the relationship between busbar zero-sequence voltage and residual current at fault grounding points, zero-sequence voltage serves as the criterion for transitioning arc extinction methods. Initially, voltage-type arc extinction is employed. Upon detecting a voltage dead zone using zero-sequence voltage, the method switches to current-type arc extinction, ultimately ensuring reliable extinguishing of fault point arcs.

The present application initiates arc extinction of the target faulty phase in the distribution network using a voltage-based strategy. During this process, the critical zero-sequence voltage is computed based on the residual current value at the fault point. Subsequently, the determination of whether the faulty phase resides within the voltage arc extinction dead zone is made by comparing the critical zero-sequence voltage with the actual zero-sequence voltage. If it falls within the dead zone, a current-based arc extinction strategy is employed. This involves compensating active arc current at the neutral point of the distribution network to reduce ground fault currents, thereby achieving control of ground fault currents to zero and enabling automatic transition between voltage-based and current-based arc extinction strategies.

For a more comprehensive understanding of the aforementioned technical solution, the following detailed description of exemplary embodiments is provided with reference to the accompanying drawings. While the figures illustrate exemplary embodiments disclosed herein, it should be understood that this disclosure can be implemented in various forms and is not limited to the embodiments described herein. Rather, these embodiments are presented to facilitate a thorough understanding of the disclosure and to convey its full scope to those skilled in the art.

As an implementation approach, FIG. 1 depicts a schematic diagram of the hardware operational environment of the active arc extinction voltage-current conversion system for distribution networks involved in an embodiment of the present invention.

As shown in FIG. 1, the active arc extinction voltage-current conversion system for the distribution network may comprise the following components: a processor 1001, such as a CPU; memory 1005; user interface 1003; network interface 1004; and communication bus 1002. The communication bus 1002 facilitates interconnection and communication among these components. The user interface 1003 could include a display, input units such as a keyboard, and optionally standard wired or wireless interfaces. The network interface 1004 may optionally include standard wired or wireless interfaces, such as Wi-Fi. The memory 1005 could be high-speed RAM or non-volatile memory, such as disk storage. Additionally, memory 1005 may optionally be a storage device independent of the aforementioned processor 1001.

It is understood by those skilled in the art that the architecture of the active arc extinction voltage-current conversion system for distribution networks, as depicted in FIG. 1, does not limit the configuration of said system. Variations may include additional or fewer components than illustrated, combinations of certain components, or different arrangements thereof.

As depicted in FIG. 1, the memory 1005, serving as a storage medium, may include an operating system, network communication modules, user interface modules, and the active arc extinction voltage-current conversion program for the distribution network. The operating system is a program that manages and controls both hardware and software resources of the active arc extinction voltage-current conversion system for the distribution network, facilitating the execution of the conversion program and other software or applications.

In the active arc extinction voltage-current conversion system for distribution networks depicted in FIG. 1, the user interface 1003 primarily serves to connect with terminals for data communication. The network interface 1004 is utilized for communication with backend servers. The processor 1001 is employed to invoke the active arc extinction voltage-current conversion program stored in memory 1005.

In this embodiment, the active arc extinction voltage-current conversion system for distribution networks comprises memory 1005, processor 1001, and the active arc extinction voltage-current conversion program stored in the memory, executable on the processor, wherein:

When processor 1001 invokes the active arc extinction voltage-current conversion program stored in memory 1005, it performs the following operations:

Detecting a single-phase-to-ground fault in the distribution network and identifying the target faulty phase.

Injecting compensating currents into the identified faulty phase to reduce its voltage.

Obtaining the residual current value at the fault point of the target faulty phase during the injection of compensating currents, as well as the present zero-sequence voltage of the target faulty phase.

Determining the critical zero-sequence voltage threshold based on the present residual current value at the fault point, and checking if this critical value exceeds the present zero-sequence voltage.

If it does, ceasing the injection of compensating currents into the target faulty phase and instead injecting active arc-suppression currents into the neutral point of the distribution network to reduce the ground current at the grounding point of the distribution network.

When processor 1001 invokes the active arc extinction voltage-current conversion program stored in memory 1005, it performs the following operations:

Determining the absolute product of the residual current value at the present fault point and the initial voltage value of the faulty phase prior to the fault occurrence; and Obtaining the additional excitation voltage at the fault point after injecting compensating currents, predefined admittance parameters, faulty phase electromotive force, and the line voltage drop from the bus to the fault point.

Based on the residual current value at the present fault point, the initial voltage value before the fault occurred, the additional excitation voltage injected, predefined admittance parameters, faulty phase electromotive force, and the line voltage drop, the critical zero-sequence voltage threshold is determined.

When processor 1001 invokes the active arc extinction voltage-current conversion program stored in memory 1005, it performs the following operations:

Identifying the minimum voltage value among all voltage values, and designating the phase corresponding to this minimum voltage value as the target faulty phase;

Alternatively, evaluating the phase difference of voltage waveforms among phases and determining if these differences meet a predefined threshold. If not, identifying the phases whose phase differences do not meet the predefined threshold as the target faulty phase.

When processor 1001 invokes the active arc extinction voltage-current conversion program stored in memory 1005, it performs the following operations:

Obtaining the neutral point voltage and busbar voltage in the distribution network.

Determining a fault voltage threshold based on the busbar voltage and a predefined scaling factor.

Assessing whether the neutral point voltage is greater than or equal to the fault voltage threshold.

If affirmative, identifying the occurrence of a single-phase-to-ground fault in the distribution network.

If negative, determining the absence of a single-phase-to-ground fault in the distribution network.

Based on the aforementioned hardware architecture of the active arc extinction voltage-current conversion system for distribution networks employing relay protection technology, this invention proposes embodiments of the active arc extinction voltage-current conversion method for distribution networks.

First Embodiment

Figure 2:
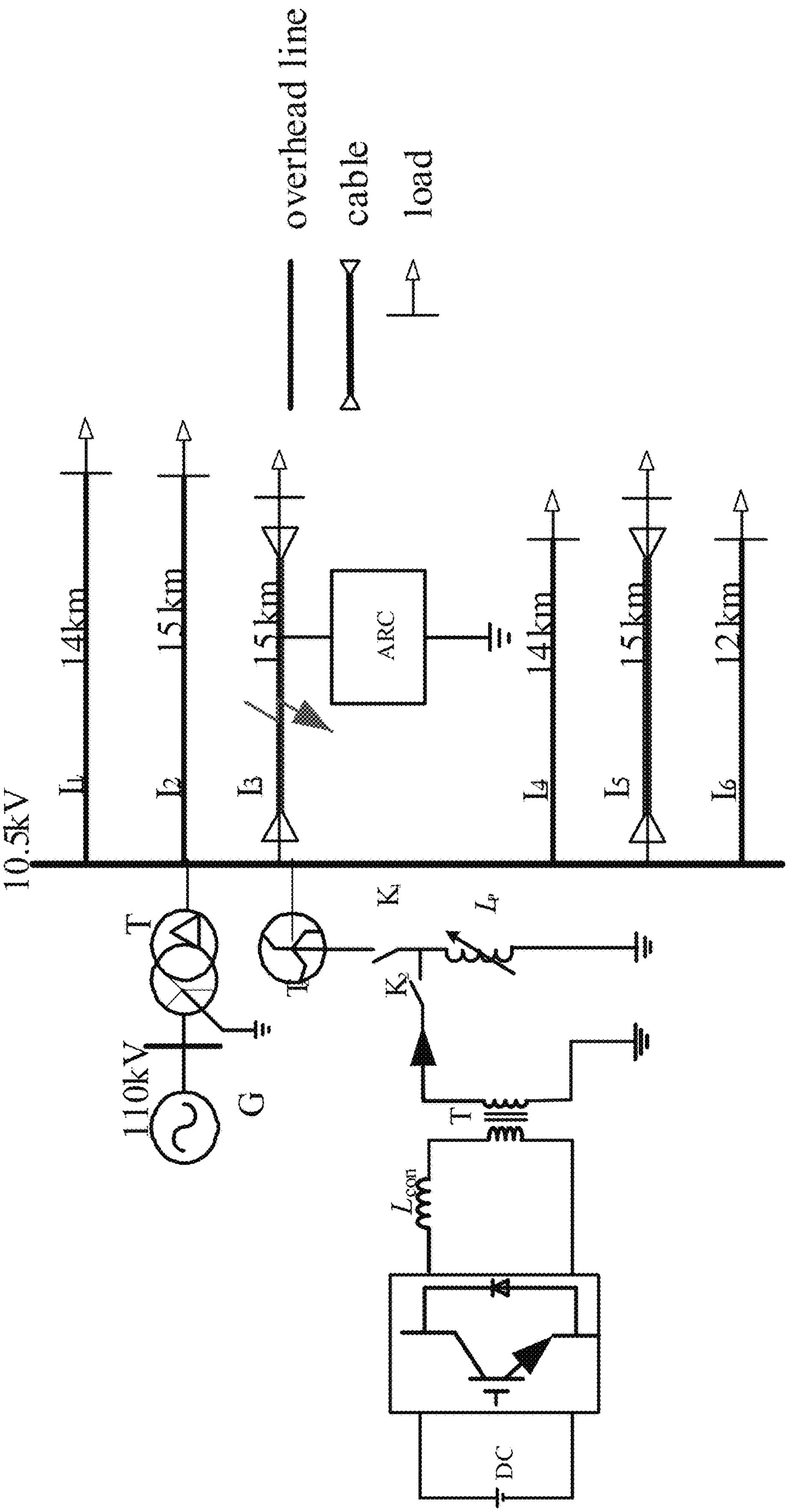
FIG. 2 depicts the construction of an arc simulation model for distribution networks based on actual operational scenarios.

Referring to FIG. 2, a distribution network arc simulation model is constructed based on the actual operation of the distribution network. Initially, the distribution network simulation model as shown in FIG. 2 is established using PSCAD/EMTDC. The substation at 110 k V/10 k V has six outgoing lines, comprising four overhead lines: L1=14 km, L2=15 km, L4=14 km, L6=12 km, and two pure cable lines: L3=15 km, L5=15 km. The positive sequence impedances of the overhead lines are: R1=0.450 Ω/km, L1=1.172 mH/km, C1=6.1 nF/km, and zero sequence impedances are: R0=0.7 Ω/km, L0=3.91 mH/km, C0=3.8 nF/km. The positive sequence impedances of the cable feeders are: R1=0.0750 Ω/km, L1=0.254 mH/km, C1=318 nF/km, and zero sequence impedances are: R0=0.1026 Ω/km, L0=0.892 mH/km, C0=212 nF/km. The neutral point of the distribution system is grounded through arc suppression coils in parallel with active inverter devices, with a single-phase-to-ground fault set in the simulation model occurring on feeder line L1, 10 km away from the busbar. Another single-phase-to-ground fault is set to occur on feeder line L3 at 0.525 s, 8 km from the busbar. Two power frequency cycles later (0.565 s), the active arc suppression device is activated, achieving reliable arc extinction through a combined voltage and current method switch between voltage-type and current-type arc extinction methods.

Figure 3:
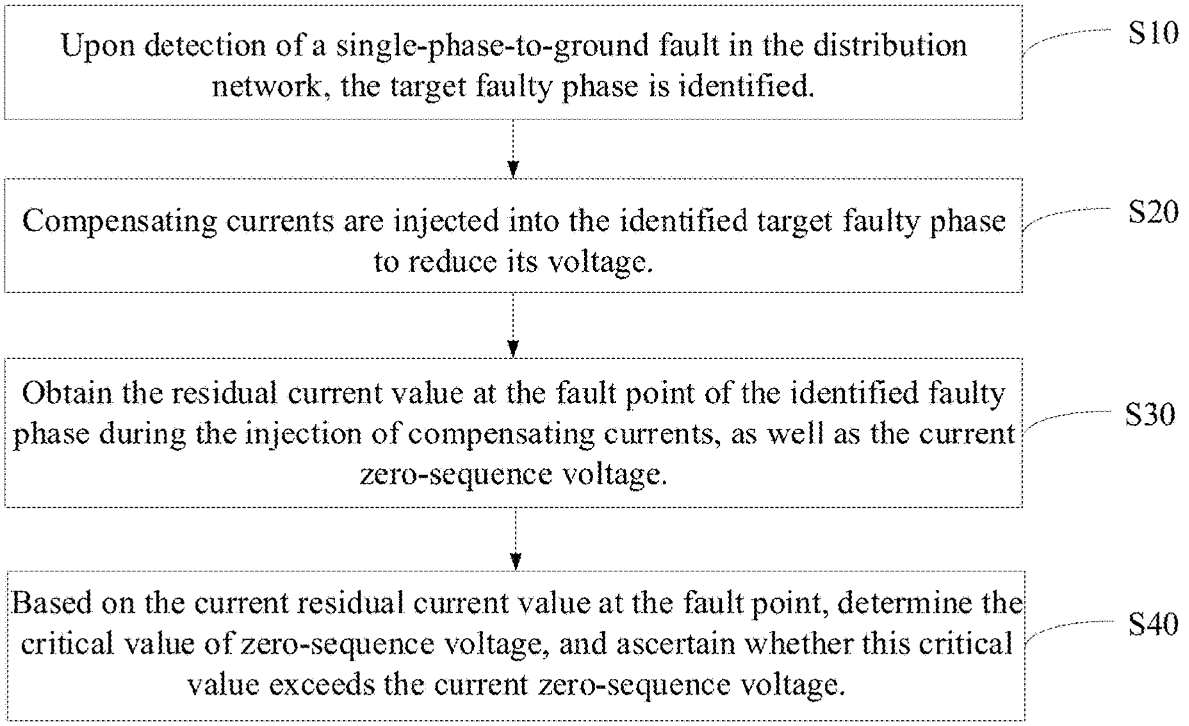
FIG. 3 presents a flowchart illustrating the first implementation example of the active arc extinguishing voltage-current conversion method in distribution networks according to the present invention.

Referring to FIG. 3, in this embodiment, the active arc extinction voltage-current conversion method for distribution networks includes the following steps;

In this exemplary embodiment, the distribution network comprises multiple phases. The active arc extinction voltage-current conversion system (hereinafter referred to as the arc extinction system) of the distribution network detects a single-phase-to-ground fault and identifies the specific faulty phase within the distribution network.

Optionally, for detecting a single-phase-to-ground fault in the distribution network, the arc extinction system acquires the neutral point voltage and bus voltage values. It establishes a fault voltage threshold based on the bus voltage value and a predefined scaling factor, and determines whether the neutral point voltage exceeds or equals the fault voltage threshold. If affirmative, the system identifies the occurrence of the single-phase-to-ground fault in the distribution network; otherwise, it determines the absence of such fault.

As an alternative implementation, the arc extinction system employs a voltage acquisition device to capture the bus voltage at the busbar. This bus voltage value is utilized to determine the fault voltage threshold, computed using the bus voltage value and the predefined scaling factor. Optionally, the fault voltage threshold is calculated as the product of the bus voltage value and the scaling factor. Following the determination of the fault voltage threshold, the relationship between the neutral point voltage and the fault voltage threshold is compared. If the neutral point voltage is greater than or equal to the fault voltage threshold, the distribution network is identified as experiencing a single-phase-to-ground fault; otherwise, it is determined that no single-phase-to-ground fault has occurred in the distribution network.

As an illustrative example, let Um denote the bus voltage value, U0 denote the neutral point voltage value, and assume a predefined scaling factor of 15%.

If U0≥15% Um, then a single-phase-to-ground fault is detected in the line.

If U0<15% Um, then no single-phase-to-ground fault is detected in the line.

As an optional embodiment, various methods can be employed to determine the target faulty phase:

1. Identifying the minimum voltage among the measured voltages and designating the phase corresponding to this minimum voltage as the target faulty phase.

In distribution networks, under normal circumstances, phase voltages are typically uniform. However, if a fault occurs in a specific phase, its voltage will be lower than that of the other phases.

For instance, in a distribution network comprising phases A, B, and C, measured voltages could be: Phase A voltage: 220V; Phase B voltage: 220V; Phase C voltage: 218.74V. Thus, phase C can be identified as the target faulty phase.

2. Analyzing the phase differences of the voltage waveforms across phases and determining if these differences comply with a predetermined threshold value. If not, the phase(s) with phase differences outside the predefined threshold are identified as the target faulty phase(s).

In distribution networks, normal conditions dictate that phase differences of voltage waveforms are stable and closely approximate a specific value (i.e., the predetermined phase difference threshold). In the event of a fault in a phase, the phase difference of its voltage waveform will deviate from this value.

Optionally, the predetermined phase difference threshold can be set at 120 degrees. If an oscilloscope detects a phase difference in a voltage waveform deviating from 120 degrees, that phase is determined to be the target faulty phase.

Step S20 involves injecting compensating currents into the identified target faulty phase to reduce its voltage.

Step S30 entails capturing the residual fault current and the present zero-sequence voltage during the injection of compensating currents into the faulty phase.

In this embodiment, following the identification of the target faulty phase, the arc suppression system initially employs voltage-based arc suppression by injecting compensating currents into the target faulty phase to minimize its voltage, thereby approaching zero voltage for the faulty phase. Throughout this process, the arc suppression system continuously monitors and captures real-time data on the residual fault current and the present zero-sequence voltage during the injection of compensating currents. This step serves to detect any occurrence of dead zones during the voltage-based arc suppression process.

As an optional implementation, the value of compensating currents injected into the target faulty phase can be determined according to the following formula:

$$I_{in} = -E_A(Y_B + Y_C + Y_0 + Y_{con}) + E_B Y_B + E_C Y_C$$

Here, $I_{in}$ denotes the compensating current, $Y_B$, $Y_C$ represents the ground admittance for phases B and C of the normal phase, $Y_0$ denotes the ground admittance for the neutral point, $Y_{con}$ signifies the ground admittance for the active inverter, $E_A$ stands for the electromotive force of phase A, $E_B$ for phase B, and $E_C$ for phase C.

Furthermore, $Y_A=1/R_A+j\omega C_A$, $Y_B=1/R_B+j\omega C_B$, $Y_C=1/R_C+j\omega C_C$, $Y_0=-1/j\omega L_p$, $Y_{con}=-1/j\omega L_{con}$ ω denotes the angular frequency of the voltage. $C_A$. $C_B$. $C_C$ represent the capacitances of phases A, B, and C respectively. $L_p$ stands for the neutral point inductance, while $L_{con}$ denotes the active inverter's ground inductance.

Step S40 involves determining the zero-sequence voltage threshold based on the residual current value at the present fault point, and assessing whether this threshold exceeds the present zero-sequence voltage value.

In this embodiment, following the acquisition of the residual current value at the faulty phase during the compensation current process, and the present zero-sequence voltage value, a determination is made regarding the presence of a dead zone in the distribution network during arc extinction based on these values. Specifically, the zero-sequence voltage threshold is determined according to the present residual current value, followed by an assessment of whether the present zero-sequence voltage value is less than or equal to this threshold. If it is less than or equal to, a dead zone is identified.

As an optional implementation, methods for determining the zero-sequence voltage threshold based on the present residual current value are considered. Initially, the absolute product between the present residual current value and the initial voltage value of the faulty phase before fault occurrence is determined. Additionally, factors such as the initial voltage value before the fault occurrence, the additional excitation voltage injected into the fault point after compensating current injection, preset admittance parameters, faulty phase electromotive force, and line voltage drop from the bus to the fault point are obtained. Subsequently, the zero-sequence voltage threshold is determined based on the present residual current value, the initial voltage value, For illustrative purposes, let the present residual current value at the fault point be $\Delta\dot{I}^f$, the present zero-sequence voltage be $\dot{U}_0$, the initial voltage value before fault occurrence be $\dot{U}_f$, the additional excitation voltage injected into the fault point be $\dot{U}_f$, and the preset admittance parameters be $Y_{0m}$ and $Y_{0n}$. The electromotive force of the faulty phase and the line voltage drop from the bus to the fault point are denoted as $E_A$ and Z, respectively.

The relationship between the residual current $I_{in}$ and the zero-sequence voltage $\dot{U}_0$ after injecting voltage arc-quenching current $\Delta\dot{I}_f$ can be expressed within the range as follows:

$$\dot{U}_0 = \frac{\left|-\dot{U}_f * \Delta\dot{I}_f\right|}{\left(\dot{U}_f^* - E_A - Z * \Delta\dot{I}_f\right)(Y_{0m} + Y_{0n})\ Y_{0n} + \Delta\dot{I}_f}$$

Due to the condition where line voltage drop during normal operation does not exceed 5%, i.e., $|\dot{U}_f - E_A \leq 5\%\ E_A$, and ensuring residual current is less than 5 A, the critical value $\dot{U}_{0con}$ of zero-sequence voltage is determined. This critical value serves as the transition criterion between voltage-type and current-type arc quenching, expressed as:

$$\dot{U}_{0con} = \frac{5\dot{U}_f}{\left(\dot{U}_f^* - E_A - Z * \Delta\dot{I}_f\right)(Y_{0m} + Y_{0n})\ Y_{0n} + \Delta\dot{I}_f}$$

In the event of arc extinction dead zone, a scenario arises where the critical zero-sequence voltage threshold $\dot{U}_{0con}$ exceeds the present zero-sequence voltage $\dot{U}_0$, i.e., $\dot{U}_{0con} \geq \dot{U}_0 \geq 0$.

Step S50: If so, cease injecting compensating current into the target faulty phase and instead compensate active arc extinguishing current at the neutral point of the distribution network to reduce the grounding point current.

In this embodiment, upon detecting the occurrence of voltage arc extinction dead zone, cessation of compensating current injection into the target faulty phase is followed by adopting a current arc extinguishing strategy. Active arc extinguishing current is then compensated at the neutral point of the distribution network to diminish the grounding point current, thereby maintaining the fault current at the grounding point at zero.

Figure 4:
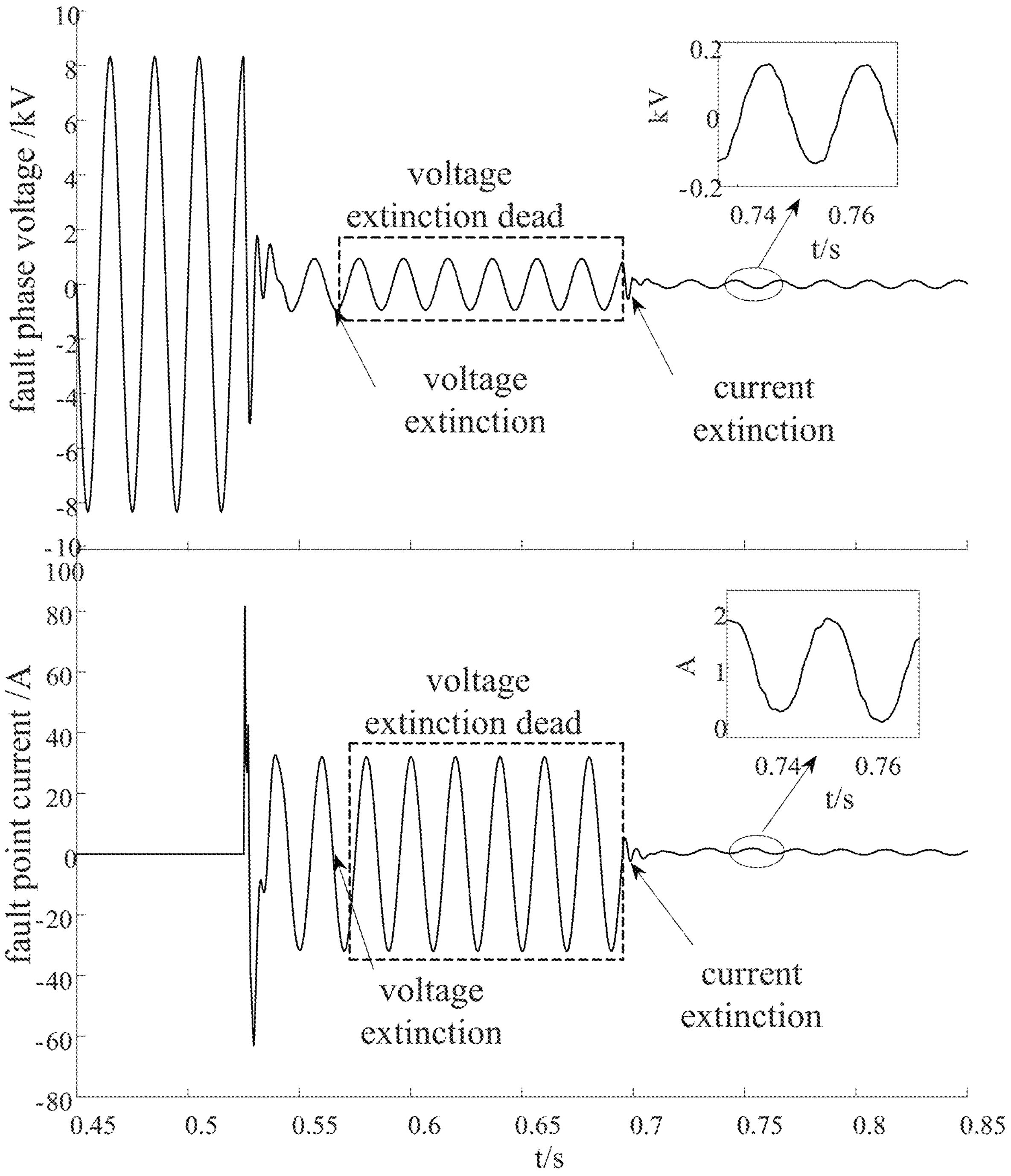
FIG. 4 displays waveform diagrams of faulty phase voltage and fault point current relevant to embodiments of the present invention.

For illustration, refer to FIG. 4 which depicts waveform diagrams of faulty phase voltage and fault point voltage during the arc extinction process using voltage and current arc extinguishing strategies.

In the technical solution provided in this embodiment, initially, a voltage arc extinguishing strategy is employed to extinguish the target faulty phase in the distribution network. During this process, the critical zero-sequence voltage threshold is determined based on the residual current value at the fault point. Subsequently, whether the faulty phase is within the voltage arc extinction dead zone is assessed by comparing the critical zero-sequence voltage threshold with the zero-sequence voltage. If it falls within this zone, a switch to a current arc extinguishing strategy occurs. Active arc extinguishing current is compensated at the neutral point of the distribution network to reduce grounding point current, thereby maintaining the fault current at the grounding point at zero, thereby achieving automatic transition from voltage arc extinguishing to current arc extinguishing.

Second Embodiment

Figure 5:
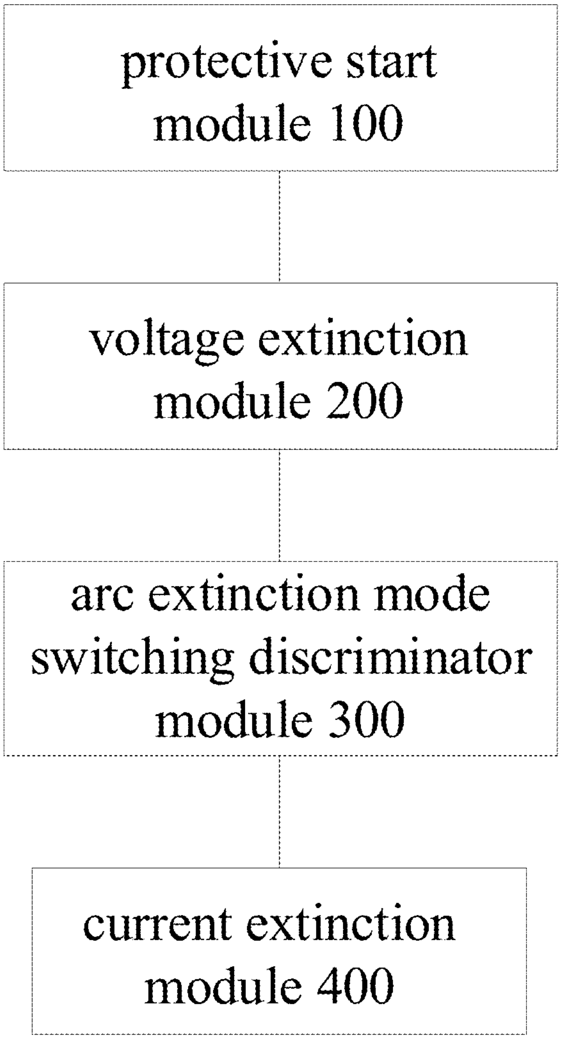
FIG. 5 outlines the architectural diagram of the active arc extinguishing voltage-current conversion system in distribution networks for the method described herein.
Figure 6:
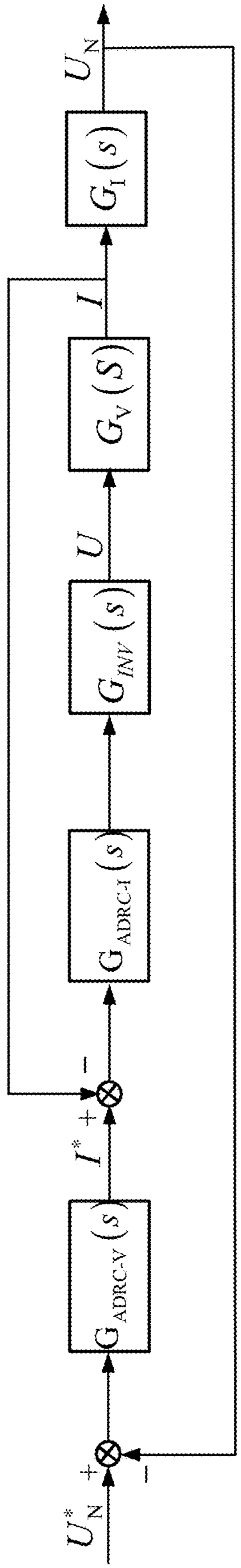
FIG. 6 shows the control diagram of the voltage-type dual-robust disturbance rejection structure.
Figure 7:
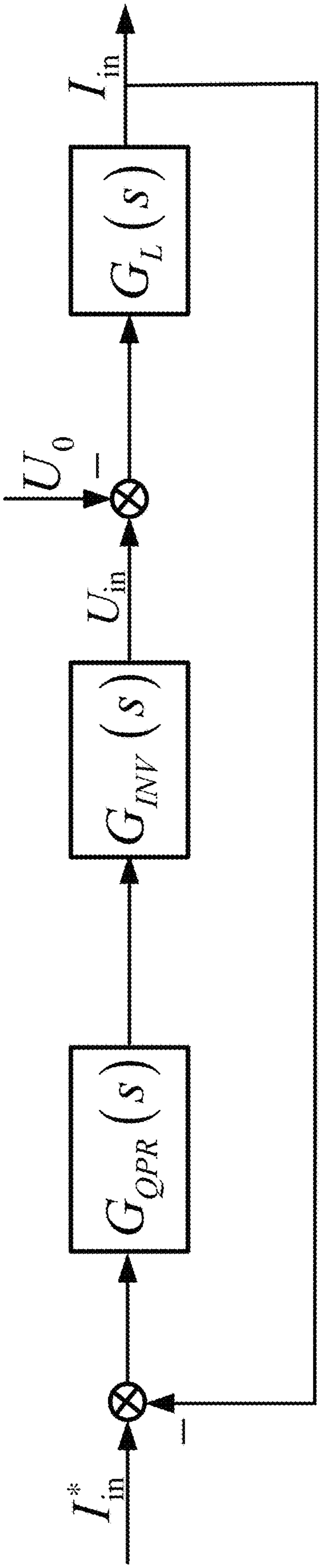
FIG. 7 illustrates the closed-loop control diagram for the current-type approach.

Referring to FIG. 5, this embodiment proposes a grid-connected active arc extinction voltage-current conversion system, which operates as described in the first embodiment. The system includes:

Protection initiation module 100, used to identify the target faulty phase upon detection of a single-phase ground fault in the distribution grid;

Voltage arc extinction module 200, designed to inject compensating current into the identified faulty phase to reduce its voltage, and to cease injection of compensating current when the present zero-sequence voltage falls below or equals the zero-sequence voltage threshold;

Arc extinction mode switching discrimination module 300, responsible for acquiring the residual current value at the fault point during the injection of compensating current into the target faulty phase, as well as the present zero-sequence voltage of the target faulty phase. It determines the zero-sequence voltage threshold based on the present residual current value and verifies if this threshold exceeds the present zero-sequence voltage;

Current arc extinction module 400, used to inject active arc extinction current into the neutral point of the distribution grid when the zero-sequence voltage threshold exceeds the present zero-sequence voltage;

As an optional implementation, the grid-connected active arc extinction voltage-current conversion system further includes control module 500, comprising:

Voltage-current dual sliding mode disturbance rejection control module, responsible for controlling the current magnitude of voltage arc extinction;

Quasi-proportional resonance closed-loop control module, responsible for controlling the current magnitude of current arc extinction.

Within the voltage-current dual sliding mode disturbance rejection control module lies the current inner loop transfer function and the voltage outer loop transfer function. The expression for the current inner loop transfer function $G_1$ is as follows:

$$G_1(s) = \frac{G_{in}(s) * G_{INV}(s) * G_V(s)}{1 + G_{in}(s) * G_{INV}(s) * G_V(s)}$$

In this context, $G_{in}$ (s) represents the transfer function of the inner loop sliding mode disturbance controller, $G_{INV}$ (s)=$K_{INV}$, $K_{INV}$ denotes the inverter proportional coefficient; $G_V$(s) signifies the transfer function relating injected current to output voltage, $G_V$(s)=1/sL+$G_I$ (s); and $G_I$ (s) denotes the transfer function relating injected current to neutral point voltage.

$$G_I(s) = \frac{R_{eq} R_f L_p s}{R_{eq} R_f L_p C_{eq} s^2 + R_{eq} L_p s + R_f L_p s + R_{eq} R_f}$$

In this context, $R_{eg}$ denotes the equivalent three-phase-to-ground leakage resistance, $C_{eq}$ represents the equivalent three-phase-to-ground capacitance, s is the Laplace transform operator used to convert a function with real variables into a function with complex variable s, $L_p$ signifies the arc suppression coil, and $R_f$ denotes the transient resistor.

$$R_{eq} = \frac{R_A R_B R_C}{R_A R_B + R_B R_C + R_A R_C}$$

$$C_{eq} = C_A + C_B + C_C$$

The expression for the voltage outer-loop transfer function $G_2$ (s) is provided below:

$$G_2 = \frac{G_{out}(s) * G_{inner}(s) * G_I(s)}{1 + G_{out}(s) * G_{inner}(s) * G_I(s)}$$

In this context, $G_{out}$ (s) denotes the inner loop sliding mode disturbance controller transfer function, $G_{inner}$ (s) represents the transfer function of the current inner loop, and $G_1$ (s) signifies the transfer function relating injected current to neutral point voltage.

As an optional embodiment, the voltage arc suppression module 200 comprises an active inverter device. The voltage arc suppression module 200 injects a controllable zero-sequence current into the neutral point of the distribution network through the active inverter device to control the point voltage of the zero-sequence loop equal in magnitude but opposite in direction to the electromotive force of the faulty phase.

As an optional embodiment, the current arc suppression module 400 includes an arc suppression coil and an equivalent controllable current source.

Herein, the arc suppression coil is connected in parallel with the equivalent controllable current source. The arc suppression coil compensates for the power frequency capacitive current in the distribution network, while the equivalent controllable current source compensates for the active component, reactive component, and harmonic component of residual current after arc suppression in the distribution network.

Additionally, those skilled in the art will appreciate that all or part of the processes in the methods of the above embodiments can be instructed by a computer program implemented through hardware. The computer program comprises program instructions stored in a computer-readable storage medium. The program instructions are executed by at least one processor in the active arc suppression voltage-current conversion system of the distribution network to implement the procedural steps of the methods described above.

Thus, the present invention further provides a computer-readable storage medium storing a computer-readable program for active arc suppression voltage-current conversion in the distribution network. The program, when executed by a processor, implements each step of the active arc suppression voltage-current conversion method in the distribution network as described in the embodiments above.

The computer-readable storage medium, as disclosed herein, may encompass various media capable of storing program code, such as USB drives, external hard drives, Read-Only Memory (ROM), magnetic disks, or optical discs.

It should be noted that the storage medium provided in embodiments of the present application is intended for implementing the methods disclosed herein. Therefore, based on the methods described in this application, persons skilled in the art can understand the specific structure and modifications of this storage medium, hence further elaboration is unnecessary herein. All storage media employed in methods according to embodiments of the present application fall within the scope sought to be protected.

Those skilled in the art should appreciate that embodiments of the invention may be provided as methods, systems, or computer program products. Thus, the invention may be implemented in hardware-only embodiments, software-only embodiments, or combinations of software and hardware embodiments. Moreover, the invention may be embodied in the form of a computer program product on one or more computer-readable storage media (including but not limited to disk storage, CD-ROMs, optical storage, etc.) containing computer-usable program code.

The invention is described with reference to flowcharts and/or block diagrams illustrating methods, apparatus (systems), and computer program products according to embodiments of the invention. It should be understood that each flow and/or block depicted in the flowcharts and/or block diagrams can be implemented by computer program instructions. These computer program instructions may be provided to a general-purpose computer, special-purpose computer, embedded processor, or other programmable data processing apparatus to produce a machine, such that the instructions executed by the computer or other programmable data processing apparatus implement the functions specified in the flowchart or block diagram.

The computer program instructions may also be stored in a computer-readable memory that can direct a computer or other programmable data processing apparatus to operate in a particular manner, such that the instructions stored in the computer-readable memory produce an article of manufacture including instructions that implement the function specified in the flowchart or block diagram.

These computer program instructions can also be loaded onto a computer or other programmable data processing apparatus to enable execution of a series of operations steps on the computer or other programmable apparatus to produce a computer-implemented process, wherein the instructions executed on the computer or other programmable apparatus provide steps for implementing functionality specified in a flowchart of one or more processes and/or a block diagram of one or more blocks.

It is noted that in the claims, any reference signs placed in parentheses should not be construed as limiting the claims. The word "comprising" does not exclude the presence of elements or steps other than those listed in the claims. The use of the words "a" or "an" preceding an element does not exclude the presence of a plurality of such elements. The invention may be implemented with the aid of hardware comprising several different components and/or by appropriately programmed computer. In the claims enumerating various units, several of these units can be embodied by the same hardware item. The use of the words first, second, and third, etc., does not denote any order. These terms can be interpreted as labels.

Although preferred embodiments of the present invention have been described, those skilled in the art will readily understand that various changes and modifications can be made thereto once they have the benefit of the basic inventive concept. Therefore, the appended claims are intended to encompass all such changes and modifications as fall within the true spirit and scope of the invention.

Clearly, skilled artisans in this field can make various alterations and modifications to the present invention without departing from the spirit and scope of the invention. Accordingly, if these modifications and variations of the present invention are within the scope of the claims and their equivalents, the present invention intends to include such alterations and modifications.

What is claimed is:

1. A method for active arc-suppression voltage-current conversion in a distribution network, comprising:

detecting a single-phase-to-ground fault in the distribution network and identifying a target faulty phase;

injecting compensating currents into the target faulty phase to reduce a voltage of the target faulty phase;

obtaining a residual current value at a fault point of the target faulty phase during an injection of the compensating currents, as well as a present zero-sequence voltage of the target faulty phase;

determining a critical zero-sequence voltage threshold based on the residual current value at the fault point, and checking whether the critical zero-sequence voltage threshold exceeds the present zero-sequence voltage;

when the critical zero-sequence voltage threshold exceeds the present zero-sequence voltage, ceasing the injection of the compensating currents into the target faulty phase and instead injecting active arc-suppression currents into a neutral point of the distribution network to reduce a ground current at a grounding point of the distribution network.

2. The method according to claim 1, wherein determining the critical zero-sequence voltage threshold based on the residual current value at the fault point comprises:

determining an absolute product of the residual current value at the fault point and an initial voltage value of the target faulty phase prior to a fault occurrence; and obtaining an additional excitation voltage at the fault point after injecting the compensating currents, predefined admittance parameters, faulty phase electromotive force, and a line voltage drop from a bus to the fault point; and determining the critical zero-sequence voltage threshold based on the residual current value at the fault point, the initial voltage value before a fault occurred, the additional excitation voltage, the predefined admittance parameters, the faulty phase electromotive force, and the line voltage drop.

3. The method according to claim 1, wherein a current magnitude of the compensating currents is:

$$I_{in} = -E_A(Y_B + Y_C + Y_0 + Y_{con}) + E_B Y_B + E_C Y_C$$

wherein $I_{in}$ denotes a compensating current, $Y_B$ represents a ground admittance of a phase B of a normal phase, $Y_C$ represents a ground admittance of a phase C of the normal phase, $Y_0$ denotes a ground admittance for the neutral point, $Y_{con}$ signifies a ground admittance for an active inverter, $E_A$ stands for an electromotive force of a phase A, $E_B$ stands for an electromotive force of the phase B, and $E_C$ stands for an electromotive force of the phase C.

4. The method according to claim 1, wherein the identifying the target faulty phase comprises:

identifying a minimum voltage value among all voltage values, and designating a phase corresponding to the minimum voltage value as the target faulty phase; or evaluating a phase difference of voltage waveforms among phases and determining whether the phase difference meets a predefined threshold; identifying a phases whose phase differences does not meet the predefined threshold as the target faulty phase.

5. The method according to claim 1, further comprising, prior to determining the target faulty phase:

obtaining a neutral point voltage and a busbar voltage in the distribution network;

determining a fault voltage threshold based on the busbar voltage and a predefined scaling factor;

assessing whether the neutral point voltage is greater than or equal to the fault voltage threshold;

when the neutral point voltage is greater than or equal to the fault voltage threshold, identifying an occurrence of the single-phase-to-ground fault in the distribution network;

when the neutral point voltage is less than the fault voltage threshold, determining an absence of the single-phase-to-ground fault in the distribution network.

6. A system for active arc-suppression voltage-current conversion in the distribution network, configured for the method according to claim 1, wherein the system comprises:

a protection initiation module configured to identify the target faulty phase upon detecting the single-phase-to-ground fault in the distribution network;

a voltage arc extinction module employed to inject the compensating currents into the target faulty phase to reduce the voltage of the target faulty phase; and ceases an injection of the compensating currents into the target faulty phase when the present zero-sequence voltage is less than or equal to the critical zero-sequence voltage threshold;

an arc extinction mode switching discrimination module designed to; acquire the residual current value at the fault point and the present zero-sequence voltage of the target faulty phase during the injection of the compensating currents; and determines the critical zero-sequence voltage threshold based on the residual current value at the fault point and verify whether the critical zero-sequence voltage threshold exceeds the present zero-sequence voltage; and a current arc extinction module configured to compensate for active arc currents at the neutral point of the distribution network when the critical zero-sequence voltage threshold exceeds the present zero-sequence voltage.

7. The system according to claim 6, wherein the voltage arc extinction module injects an adjustable zero-sequence current into the neutral point of the distribution network.

8. The system according to claim 6, wherein the current arc extinction module comprises an arc suppression coil;

wherein the arc suppression coil compensates for a fundamental frequency capacitive current in the distribution network.

9. The system according to claim 6, wherein in the method, determining the critical zero-sequence voltage threshold based on the residual current value at the fault point comprises:

determining an absolute product of the residual current value at the fault point and an initial voltage value of the target faulty phase prior to a fault occurrence; and obtaining an additional excitation voltage at the fault point after injecting the compensating currents, predefined admittance parameters, faulty phase electromotive force, and a line voltage drop from a bus to the fault point; and determining the critical zero-sequence voltage threshold based on the residual current value at the fault point, the initial voltage value before a fault occurred, the additional excitation voltage, the predefined admittance parameters, the faulty phase electromotive force, and the line voltage drop.

10. The system according to claim 6, wherein in the method, a current magnitude of the compensating currents is:

$$I_{in} = -E_A(Y_B + Y_C + Y_0 + Y_{con}) + E_B Y_B + E_C Y_C$$

wherein $I_{in}$ denotes a compensating current, $Y_B$ represents a ground admittance of a phase B of a normal phase, $Y_C$ represents a ground admittance for a phase C of the normal phase, $Y_0$ denotes a ground admittance for the neutral point, $Y_{con}$ signifies a ground admittance for an active inverter, $E_A$ stands for an electromotive force of a phase A, $E_B$ stands for an electromotive force of the phase B, and $E_C$ stands for an electromotive force of the phase C.

11. The system according to claim 6, wherein in the method, identifying the target faulty phase comprises:

identifying a minimum voltage value among all voltage values, and designating a phase corresponding to the minimum voltage value as the target faulty phase; or evaluating a phase difference of voltage waveforms among phases and determining whether the phase difference meets a predefined threshold; identifying a phases whose phase differences does not meet the predefined threshold as the target faulty phase.

12. The system according to claim 6, wherein the method further comprises, prior to determining the target faulty phase:

obtaining a neutral point voltage and a busbar voltage in the distribution network;

determining a fault voltage threshold based on the busbar voltage and a predefined scaling factor;

assessing whether the neutral point voltage is greater than or equal to the fault voltage threshold;

when the neutral point voltage is greater than or equal to the fault voltage threshold, identifying an occurrence of the single-phase-to-ground fault in the distribution network;

when the neutral point voltage is less than the fault voltage threshold, determining an absence of the single-phase-to-ground fault in the distribution network.

13. A computer-readable storage medium, wherein the computer-readable storage medium stores an active arc voltage-current conversion program for the distribution network; the active arc voltage-current conversion program, when executed by a processor, implements the steps of the method according to claim 1.

14. The computer-readable storage medium according to claim 13, wherein in the method, determining the critical zero-sequence voltage threshold based on the residual current value at the fault point comprises:

determining an absolute product of the residual current value at the fault point and an initial voltage value of the target faulty phase prior to a fault occurrence; and obtaining an additional excitation voltage at the fault point after injecting the compensating currents, predefined admittance parameters, faulty phase electromotive force, and a line voltage drop from a bus to the fault point; and determining the critical zero-sequence voltage threshold based on the residual current value at the fault point, the initial voltage value before a fault occurred, the additional excitation voltage-injected, the predefined admittance parameters, the faulty phase electromotive force, and the line voltage drop.

15. The computer-readable storage medium according to claim 13, wherein in the method, a current magnitude of the compensating currents is:

$$I_{in} = -E_A(Y_B + Y_C + Y_0 + Y_{con}) + E_B Y_B + E_C Y_C$$

wherein $I_{in}$ denotes a compensating current, $Y_B$ represents a ground admittance of a phase B of a normal phase, $Y_C$ represents a ground admittance for a phase C of the normal phase, $Y_0$ denotes a ground admittance for the neutral point, $Y_{con}$ signifies a ground admittance for an active inverter, $E_A$ stands for an electromotive force of a phase A, $E_B$ stands for an electromotive force of the phase B, and $E_C$ stands for an electromotive force of the phase C.

16. The computer-readable storage medium according to claim 13, wherein in the method, identifying the target faulty phase comprises:

identifying a minimum voltage value among all voltage values, and designating a phase corresponding to the minimum voltage value as the target faulty phase; or evaluating a phase difference of voltage waveforms among phases and determining whether the phase difference meets a predefined threshold; and identifying a phases whose phase differences does not meet the predefined threshold as the target faulty phase.

17. The computer-readable storage medium according to claim 13, wherein the method further comprises, prior to determining the target faulty phase:

obtaining a neutral point voltage and a busbar voltage in the distribution network;

determining a fault voltage threshold based on the busbar voltage and a predefined scaling factor;

assessing whether the neutral point voltage is greater than or equal to the fault voltage threshold;

when the neutral point voltage is greater than or equal to the fault voltage threshold, identifying an occurrence of the single-phase-to-ground fault in the distribution network;

when the neutral point voltage is less than the fault voltage threshold, determining an absence of the single-phase-to-ground fault in the distribution network.

* * * * *